(12) United States Patent
Hopper et al.

(10) Patent No.: US 7,427,360 B2
(45) Date of Patent: *Sep. 23, 2008

(54) PROCESS AND INK FOR MAKING ELECTRONIC DEVICES

(75) Inventors: Alan John Hopper, Manchester (GB); Mark Robert James, Manchester (GB)

(73) Assignee: Fujifilm Imaging Colorants Limited, Manchester (GB)

( * ) Notice: Subject to any disclaimer, the term of this patent is extended or adjusted under 35 U.S.C. 154(b) by 295 days.

This patent is subject to a terminal disclaimer.

(21) Appl. No.: 10/528,582

(22) PCT Filed: Aug. 22, 2003

(86) PCT No.: PCT/GB03/03697

§ 371 (c)(1), (2), (4) Date: Oct. 18, 2005

(87) PCT Pub. No.: WO2004/026977

PCT Pub. Date: Apr. 1, 2004

(65) Prior Publication Data

US 2006/0154033 A1    Jul. 13, 2006

(30) Foreign Application Priority Data

Sep. 20, 2002   (GB) ................................ 0221892.3

(51) Int. Cl.
*C23F 1/00*   (2006.01)

(52) U.S. Cl. .............................. 216/13; 216/41; 216/49; 216/83; 216/100; 216/105; 430/313; 430/318; 430/329

(58) Field of Classification Search ........................ None
See application file for complete search history.

(56) References Cited

U.S. PATENT DOCUMENTS

| 4,270,985 A | 6/1981 | Lipson et al. |
| 4,416,974 A | 11/1983 | Scheve |
| 5,204,383 A | 4/1993 | Manabe et al. ............... 523/118 |
| 5,439,982 A | 8/1995 | Taylor et al. |
| 2001/0041755 A1 | 11/2001 | Ito et al. ...................... 525/161 |
| 2002/0086914 A1 | 7/2002 | Lee et al. ...................... 522/75 |

FOREIGN PATENT DOCUMENTS

| EP | 0 540 203 B2 | 10/2001 |
| GB | 2 237 887 A | 5/1991 |
| GB | 2237887 A * | 5/1991 |
| GB | 2 371 551 A | 7/2002 |
| WO | WO 99/29787 | 6/1999 |
| WO | WO 99/29788 | 6/1999 |

* cited by examiner

*Primary Examiner*—Anita K Alanko
(74) *Attorney, Agent, or Firm*—Morgan, Lewis & Bockius LLP

(57) ABSTRACT

A process for making an electronic device comprising a dielectric substrate laminated with an electrically conductive metal or alloy which comprises applying a non-aqueous etch-resistant ink by ink jet printing to selected areas of the metal or alloy, exposing the etch-resistant ink to actinic radiation and/or particle beam radiation to effect polymerisation, removing exposed metal or alloy by a chemical etching process and then removing the polymerised etch-resistant ink by alkali wherein the etch-resistant ink is substantially solvent free and comprises the components:

A) 30 to 90 parts acrylate functional monomers free from acid groups comprising mono or higher functionality wherein 5-95% by weight is one or more mono-functional monomers;
B) 1 to 30 parts acrylate functional monomer containing one or more acid groups;
C) 0 to 20 parts polymer or prepolymer;
D) 0 to 20 parts radical initiator;
E) 0 to 5 parts colorant;
F) 0 to 5 parts surfactant; and wherein the ink has a viscosity of not greater than 30 cPs (mPa.s) at 40° C. and all parts are by weight.

13 Claims, No Drawings

PROCESS AND INK FOR MAKING ELECTRONIC DEVICES

The present invention relates to a process for making printed circuit boards which comprises applying to a laminate of a dielectric substrate and an electrically conductive metal a non-aqueous etch-resistant acrylate ink by ink jet printer, polymerising the ink by exposure to actinic or particle beam radiation, chemically removing the exposed metal by a chemical etching process and finally removing the etch-resistant ink by chemical treatment.

Printed circuit boards are typically made by a complex process such as a dry film negative photo-resist process involving six or more discreet stages. Firstly, a dielectric substrate is laminated or coated with copper and the copper surface is then overlaid with a photo-resist layer. A photo-tool is prepared which is a negative of the required electrically conductive circuitry of the printed circuit and is often a silver photographic emulsion plate. The photo-tool is placed directly over the photo-resist layer and is then exposed to UV light. This causes the photo-resist layer to polymerise and harden in those areas exposed to the UV light to produce a latent negative image of the required electrically conductive circuitry in the photo-resist layer. The photo-resist layer is then chemically treated to remove the unexposed area of the photo-resist. This chemical treatment is typically mildly alkaline where the photo-resistant layer contains free carboxylic acid groups.

The exposed copper is then selectively removed by chemical etching from those areas not protected by the photo-resist layers. Finally, the exposed areas of the photo-resist layer are removed chemically, for example using stronger aqueous alkali where the photo-layer contains free carboxylic acid groups.

Although the process is widely used in the manufacture of printed circuit boards (hereinafter PCB's) it is tedious, expensive and wasteful of materials since the photo-resist layer is made separately and applied over the total area of the copper/dielectric substrate laminate. Furthermore, the photo-tool containing the negative image of the desired electrically conductive circuitry is often distanced from the photo-resist layer so that diffraction of the UV light irradiation occurs leading to development and polymerisation in areas of the photo-resist not directly beneath the UV transparent areas of the photo-tool. This needs to be taken into consideration when preparing the photo-tool and can reduce the density and definition of the electrically conductive circuitry. Furthermore, the chemical structure of the photo-resist needs to be very carefully controlled since its removal both before and after exposure to UV light depends on an alkaline treatment. The density and integrity of the intended electrically conductive circuitry can be seriously compromised if either the unexposed photo-resist is incompletely removed or if some of the exposed and polymerised photo-resist is removed prior to chemically etching the copper.

Therefore, there exists a significant attraction in applying a photo-resist to specific areas of a copper/dielectric laminate using ink jet printing technology since it removes the need for a photo-tool. The image, or negative image, is made digitally available direct from a computer, the number of processing steps is halved, the need for differential stripping of the photo-resist using different strengths of aqueous alkali is avoided and since there is no photo-tool which is distanced from the photo-resist layer there is the potential for improved definition and density of the circuitry. There also exists the cost saving in terms of photo-resist material since the photo-resist is only applied to those areas to be protected from chemical etching.

Because of the potential benefits offered by direct negative imaging of the photo-resist using ink jet technology there have been some attempts at developing this technology for the manufacture of PCB's. Thus, U.S. Pat. No. 5,270,368 discloses a UV curable, etch-resistant ink composition for ink jet application which comprises a resin formulation of two or more resin components, a photoinitiator and an organic carrier. The resins are relatively high molecular weight which limits the amount present in the ink and the organic carrier is required to reduce the viscosity of the ink to render it jettable. Apart from being hazardous because of volatility and flammability the evaporation of the solvent can adversely affect adhesion between the copper and the photo-resist and also the integrity of the photo-resist itself which adversely impacts on the density and definition of the circuitry of the PCB.

It has been found that the potential advantages of applying a photo-resist by ink jet printing may be realised without the disadvantages of incorporating organic carriers by careful selection of monomers whilst still retaining jetability.

According to the invention there is provided a process for making an electronic device comprising a dielectric substrate laminated with an electrically conductive metal or alloy which comprises applying a non-aqueous etch-resistant ink by ink jet printing to selected areas of the metal or alloy, exposing the etch-resistant ink to actinic radiation and/or particle beam radiation to effect polymerisation, removing exposed metal or alloy by a chemical etching process and then removing the polymerised etch-resistant ink by alkali wherein the etch-resistant ink is substantially solvent free and comprises the components:

A) 30 to 90 parts acrylate functional monomers free from acid groups comprising mono or higher functionality wherein 5-95% by weight is one or more mono-functional monomers;
B) 1 to 30 parts acrylate functional monomer containing one or more acid groups;
C) 0 to 20 parts polymer or prepolymer;
D) 0 to 20 parts radical initiator;
E) 0 to 5 parts colorant;
F) 0 to 5 parts surfactant; and wherein the ink has a viscosity of not greater than 30 cPs (mPa·s) at 40° C.

As disclosed hereinbefore the etch-resistant ink is substantially free of organic solvents. By this is meant no additional solvents are required and only traces of solvents may be present as impurities or by-products in the manufacture of the various components used to make the ink. It is preferred that the ink contains not greater than 2 parts, more preferably not greater than 1 parts and especially not greater than 0.5 parts organic solvent. It is much preferred that the etch-resistant ink is free from organic solvent.

The required viscosity of the etch-resistant ink is largely dependant on the particular print head employed and especially its temperature of operation. At present most suitable commercial print heads operate at a temperature from 25° C. to 65° C. Consequently, it is preferred that the viscosity of the etch-resistant ink is not greater than 30 cPs (mPa·s) at 40° C. Viscosity can be measured on any suitable equipment but is preferably measured using a Brookfield viscometer with a rotating spindle, for example a number 18 spindle. Preferably the viscosity is not greater than 20 and especially not greater than 15 cPs (mPa·s) at 40° C. It is also preferred that the viscosity is not less than 5 and especially not less than 8 cPs (mPa·s) at 40° C. Preferably the viscosity is from 8 to 15 cPs (mPa·s) at 40° C. Preferably the operating temperature of the print head is from 30 to 60° C. and especially from 35 to 45° C.

In one embodiment the number of parts of components A)+B)+C)+D)+E)+F)=100.

Preferably the ink jet printing is carried out using a Drop on Demand (DOD) peizo ink jet printer.

The term acrylate-functional as used hereinbefore means any monomer which contains the residue of a reactive vinyl group such as $CH_2=C(R)CO-$ where R is hydrogen, alkyl or cyano. When R is alkyl it is preferably $C_{1-6}$-alkyl. It is particularly preferred that the acrylate functionality is conferred by a methacryloyl or especially an acryloyl group. The monomers may have a relatively low molecular weight or they may be oligomer or polymeric in nature and may be of a molecular weight as high as 30,000. They are distinguished from the polymers or prepolymers which is component C) of the ink composition in that they are not polymers or prepolymers derived from the polymerisation of acrylate functional monomers. They may, however, be macromolecular and may contain hydrocarbyl groups linked by one or more heteroatoms as for example in polyethers, polyamides, urethanes, polyesters and ureas. The only limitation on the type and molecular size of the acrylate functional monomers is that they must be compatible, the one with the other, they must not form separate phases in the final etch-resistant ink, the etch-resistant ink must have the prescribed viscosity and the final ink after polymerisation must be removed by an alkali treatment. Typically, the acrylate functional monomers have a molecular weight below 30,000, more preferably not greater than 10,000, even more preferably not greater than 5,000 and especially not greater than 2,000 since this helps keep the viscosity of the etch-resistant ink within the prescribed limits.

Specific examples of acrylate functional monomers free from acid groups are those which are commercially available under the Sartomer™, Actilane™ and Photomer™ trademarks such as Sartomer™ 506 (isobornyl acrylate), Sartomer™ 306 (tripropylene glycol diacrylate), Actilane™ 430 (trimethylol propane ethoxylate triacrylate), Actilane™ 251 (a tri-functional acrylate oligmer), Actilane™ 411 (a CTF acrylate), Photomer™ 4072 (trimethylol propane propoxylate triacrylate), Photomer™ 5429 (a polyester tetra acrylate) and Photomer™ 4039 (a phenol ethoxylate monoacrylate). Sartomer™, Actilane™ and Photomer™ are trademarks of Cray Valley Inc, Akros BV and Cognis Inc, respectively. Other examples of monomers are lauryl acrylate, isodecylacrylate, iso-octyl-acrylate, butyl acrylate, 2-hydroxy ethyl acrylate, 2-hydroxy propylacrylate, 2-ethyl hexyl acrylate, 1,6-hexanediol diacrylate, neopentyl glycol diacrylate, diethylene glycol diacrylate, butanediol diacrylate, trimethylolpropane triacrylate, pentaerythritol triacrylate, 1,3-butyleneglycol diacrylate, 1,4-butylene glycol diacrylate, triethylene glycol diacrylate, penta erythritol tetra acrylate, tripropylene glycol diacrylate, isobornyl acrylate, 2-norbornyl acrylate, cyclohexyl acrylate, phenoxyethyl acrylate and tetra hydrofurfuryl acrylate. Commercial samples of these acrylate functional monomers free from acid groups may in practice contain traces of acidic impurities, in which case the number of parts of acrylate functional monomers free from acid groups is taken as that part of the sample which has no acid groups, i.e. excluding any part that does have acid groups.

It is preferred that the amount of mono-functional acrylate monomer is 15-95%, more preferably not less than 40-95%, especially 60-95% and more especially not less than 70-95% by weight relative to the total weight of component A).

The acid group of the acrylate functional monomer which is component B) is preferably sulphate, phosphate and especially carboxylic acid. It is particularly preferred that the acrylate functional monomer containing one or more acid groups contains only one acid group. This acid group enables the etch-resistant printing ink to be removed from the electrically conductive metal or alloy, such as copper, of the electronic device under alkaline conditions. The acid group also promotes adhesion with the conductive metal such as copper and consequently the presence of other specific metal adhesion promoters in the ink formulation are not essential. Preferably the acid group(s) is located in a mono-functional acrylate monomer. Examples of acrylate functional monomers having one or more acid groups are acrylic acid, methacrylic acid, 2-carboxyl ethyl acrylate, 2-acetamido acrylic acid, mono-2-(acryloyloxy) ethyl succinate, 2,2-bis(acryloylamide) acetic acid, bis (2-(methacryloyloxy)ethyl phosphate, bis(3-sulphopropyl)itaconic acid, ethylene glycol methacrylate, itaconic acid, mono-2-(methacryloyloxy)ethyl phosphate, mono-2-(methacryloyloxy) ethyl succinate, 2-(sulphoxy)ethyl methacrylic acid, 2-acrylamido-2-methyl-1-propane sulphonic acid, 3-sulphopropyl acrylic acid, mono-2-(methacryloyoxy)ethyl phthalate, 3-sulphopropyl methacrylic acid, maleic acid, fumaric acid and mono-2-(acryloyloxy)ethyl phthalate. Acrylic acid, methacrylic acid and 2-carboxy ethylacrylate are much preferred as the acid group containing acrylate functional monomer.

In order to limit storage problems of etch-resistant inks which comprise an acrylate functional monomer containing an acid group it may be desirable to provide the ink in the form of a two-pack composition wherein the radical initiator (component C) is made available separately from the acrylate-functional monomer containing an acid group (component B). In one preferred two-pack composition, the radical initiator is made available in a formulation together with either some or all of the acrylate functional monomers which constitute component (A), especially the mono-functional acrylate monomers.

The amount of acid functional monomer represented by component B) is preferably not greater than 20 parts, more preferably not greater than 15 parts and especially not greater than 10 parts. It is preferred that the amount of acid functional monomers represented by component B) is not less than 3 parts and especially not less than 6 parts. Useful effects have been achieved wherein the amount of acid functional monomer is from 5 parts to 15 parts.

The precise chemical structure of many carboxylic acid-containing monomers is unknown but from their description they do contain one or more carboxylic acid moieties. Many are obtained from diols and polyols which are esterified by reaction with (meth)acrylate acid and consequently, or deliberately, contain free (meth)acrylic acid. The free (meth) acrylic acid may be the only component of the commercially available acrylate functional monomer which contains a carboxylic acid moiety. Nevertheless, for the purpose of this invention such commercial mixtures containing free (meth) acrylic acid are regarded as single compounds regarding acid values.

Preferred acrylate functional monomer containing one or more acid groups represented by component B) have an acid value of not less than 10 mg KOH/g, more preferably not less than 20, even more preferably not less than 100 mg KOH/g and especially not less than 200 mg KOH/g.

As noted hereinbefore, the etch-resistant ink must be readily removable under alkaline conditions after chemical etching of the metal. Consequently, it is preferred that the total etch resistant ink should have an acid value of greater than 30, more preferably greater than 40mg KOH/gm. Although inks having an acid value above 150 mg KOH/g may be used, there is generally no advantage in such levels.

The etch-resistant inks may be removed-under alkaline conditions which may be aqueous or solvent based. Solvent based media generally contain organic amines, especially alkanolamines such as ethanolamine. Preferred organic solvents are polar in nature since this aids their removal in subsequent aqueous rinsing. However, it is much preferred to use aqueous alkaline media, typically alkali metal hydroxides, carbonates and bicarbonates.

The polymer or prepolymer which is component C) may be any polymeric material which is compatible with the acrylic functional monomers represented by components A) and B). It is distinguished from the acrylate functional monomers represented by components A) and B) in that it is devoid of acrylate functionality and/or is derived from polymerising one or two acrylate functional monomers. The polymer or prepolymer typically has a number average molecular weight of from 500 to about 100,000, Preferably the molecular weight is not greater than 30,000 and especially not greater than 10,000. It is also preferred that the molecular weight is not less than 700 and especially not less than 1,000. The polymeric material may belong to any class of resin such as polyurethane, polyester, polyimide, polyamide, epoxy, silicone-containing resin or fluorinated resin materials, including mixtures thereof. The prepolymer or polymer may react with one or more of the acrylate functional monomers represented by components A) and B) or it may intercolate with the acrylate polymer formed by components A) and B). Although it is not a prerequisite that the polymer or prepolymer represented by component C) exhibits aqueous alkali solubility this is much preferred since it aids removal of the final etch-resistance ink after the electrically conductive circuitry is produced. In some instances where the polymer or prepolymer reacts with or strongly intercolates with the polymer formed by the acrylate-functional monomers represented by components A) and B) aqueous alkali solubility of the polymer or prepolymer represented by component C) is unnecessary.

It is preferred that the amount of component C) when present is not greater than 10 parts, more preferably not greater than 5 parts and especially not greater than 3 parts. It is especially preferred that the ink contains no component C).

The radical initiator represented by component D) may be any initiator including optional synergists which are commonly used in the trade to initiate polymerisation of acrylate functional monomers. The initiator and synergist, when present may be activated by actinic radiation such as UV radiation or by accelerated particles as, for example, in electron beam radiation. Suitable sources of actinic radiation include mercury lamps, xenon lamps, carbon arc lamps, tungsten filament lamps, lasers, electron beam and sunlight. Ultraviolet (UV) radiation is preferred especially that emitted by medium pressure mercury lamps. Preferably the radical initiator is a photo-initiator activated by UV light.

Examples of suitable radical initiators and synergists are anthraquinone, substituted anthraquinones such as alkyl and halogen substituted anthraquinones such as 2-tert butyl anthraquinone, 1-chloroanthraquinone, p-chloroanthraquinone, 2-methylanthraquinone, 2-ethylanthraquinone octamethyl anthraquinone and 2-amylanthraquinone, optionally substituted polynuclear quinones such as 1,4-naphthoquinone, 9,10-phenanthraquinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, 3-chloro-2-methylanthraquinone, retenequinone, 7,8,9,10-tetrahydronapthaanthraquinone, 1,2,3,4-tetrahydro benzanthracene-7.2-dione, acetophenones such as acetophenone, 2,2-dimethyoxy-2-phenyl acetophenone, 2,2-diethoxy-2-phenyl acetophenone, 1,1-dichloro acetophenone, 1-hydroxy cyclothexyl-phenylketone and 2-methyl-i-(4-methylthio)phenyl-2-morpholin-propan-1-one; thioxanthones such as 2-methylthioxanthone, 2-decylthioxanthone, 2-dodecylthioxanthone, 2-isopropylthioxanthone, 2,4-dimethylthioxanthone, 2,4-diethylthioxanthone, 2-chlorothioxanthone and 2,4-diisopropylthioxanthone; ketals such as acetophenone dimethylketal and dibenzylketal; benzoins and benzoin alkyl ethers such as benzoin, benzyl benzoin methyl ether, benzoin isopropyl ether and benzoin isobutyl ether; azo compounds such as azobisisovaleronitrile; benzophenones such as benzophenone, methylbenzophenone, $4,4^1$-dichlorobenzophenone, $4,4^1$-bis-diethyl amino benzophenone, Michler's ketone and xanthone, including mixtures thereof. Important commercial initiators and synergists are Speedcure™ ITX, EHA and 3040. Irgacure™ 184, 369, 907 and 1850 are Daracure™ 1173, Speedcure™, Irgacure™ and Daracure™ are registered trademarks of Lambson Plc and Ciba GmbH, respectively.

The amount of radical initiator and synergist is preferably not greater than 20 parts, more preferably not greater than 15 parts and especially not greater than 10 parts by weight.

The colorant which is component E) of the etch-resistant ink is preferably a pigment and may be organic or inorganic including those pigments with surface modification which facilitates self dispersion in the ink. The pigment may be from any of the recognised classes of pigments described, for example, in the Third Edition of the Colour Index (1971) and subsequent revisions of and supplements thereto under the chapter headed "Pigments". Examples of inorganic pigments are titanium dioxide, Prussian blue, cadmium sulphide, iron oxides, vermillion, ultramarine and the chrome pigments, including chromates, molybates and mixed chromates and sulphates of lead, zinc, barium, calcium and mixtures and modifications thereof which are commercially available as greenish-yellow to red pigments under the names primrose, lemon, middle, orange, scarlet and red chromes. Examples of organic pigments are those from the azo, diazo, condensed azo, thioindigo, indanthrone, isoindanthrone, anthanthrone, anthraquinone, isodibenzathrone, triphendioxazine, quinacridone and phthalocyanine series, especially copper phthalocyanine and its nuclear halogenated derivatives, and also lakes of acid, basic and mordent dyes. Carbon black, although strictly inorganic, behaves more like an organic pigment in its dispersing properties. Preferred organic pigments are phthalocyanines, especially copper phthalocyanines, monoazos, diazos, indanthrones, anthanthrones, quinacridones and carbon blacks.

As noted hereinbefore, the etch-resistant ink jet composition is of use in the manufacture of electrical devices comprising a dielectric substrate and a coating of a conductive layer such as PCB's. In this industrial sector the preferred colour is blue or green and hence the pigment is preferably one of the phthalocyanine series. Examples of blue pigments are C.I. Pigment Blue 1, 15, 15:1, 15:2, 15:3, 15:4, 15:6, 16, 24 and 60. Green pigments are generally a mixture of blue and yellow or orange pigments or it may be a green pigment per se such as halogenated metal phthalocyanine for example copper or a nickel brominated phthalocyanine.

The pigment is typically incorporated into the etch-resistant ink jet composition by milling it together with one or more of the acrylate functional monomers in the presence of a dispersant. The dispersant is preferably a polyester/ polyamine and is, for example, a dispersant as disclosed in U.S. Pat. No. 6,197,877. Dispersants of this type are available under the trademark Solsperse™ dispersants (Avecia Ltd). The dispersant may also include a synergist such as a quaternary ammonium salt of a partially sulphonated copper phthalocyanine pigment. Examples of such synergists are disclosed in GB-A-1508576, GB-A-2108143 and WO 01/14479 and are available under the Solsperse™ trademark.

The ratio of dispersant to synergist is typically from 1:1 to 10:1 by weight and is preferably about 5:1 by weight. The total amount of dispersant and synergist to pigment may vary over wide limits and is typically from 50% to 150% by weight relative to the weight of colorant. The amount of colorant in the etch-resistant ink is preferably not greater than 5 parts, more preferably not greater than 3 parts and especially not greater than 2 parts by weight.

The surfactant which is component F) of the etch-resistant ink composition when present may be any surface-active material which aids the homogeneity of the ink and provides desirable surface tension and wetting properties to the resultant ink. The surfactant may also be selected to adjust the viscosity of the ink composition to the desired limits. It is preferably anionic or especially non-inonic and is preferably aliphatic in nature, optionally containing silicon atoms and/or fluorine.

The surfactant is preferably reactive with the acrylate monomers (component A) and it is especially preferred that it contains one or more (meth)acrylate functional groups as defined hereinbefore. Examples of organic silicon acrylate surfactants are polysilicones containing repeat units of formula —Si($R^1$, $R^1$)—O— wherein each $R^1$ independently is monovalent hydrocarbyl which may be alkyl or aryl and also at least one group of formula —Si(—X—$R^1$—O—) wherein X is a (meth)acrylate moiety. Specific examples are Tegorad™ 2200N and 2100 of Tego Chemie.

The etch-resistant ink preferably has a surface tension of from 20 to 40 and especially between 25 and 35 mN/m. Consequently, the amount of component F) is generally from 0.1 to 0.6 parts.

The etch-resistant ink may further contain other adjuvants which are commonly used in radiation or particle beam curable compositions in addition to components A) to F) specified above. Such adjuvants include slip modifiers, thixotropic agents, foaming agents, anti-foaming agents, waxes, oils, plasticisers, binders, antioxidants, photo initiator stabilisers, gloss agents, fungicides, bactericides, organic and/or inorganic filler particles, levelling agents, opacifiers, antistatic agents and metal adhesion promoters.

The metal or alloy can be any of those which is conventionally used for electronic devices and includes gold, nickel/gold, nickel, tin, tin/lead, aluminium, tin/aluminium and especially copper.

The dielectric substrate of the electronic device may be any non-conductive material but is typically paper/resin composite, resin/fibre glass composite, ceramic, polyester or polyimide (e.g. Kapton™ of DuPont Inc).

The etch-resistant ink may be prepared by any method known to the art of radiation or particle beam curable compositions. Typically, the components A) and B) are mixed together with rapid stirring at a temperature from 20 to 60° C., preferably under reduced light conditions until a homogenous solution is obtained. Component D) is then added and stirring continued at 20 to 60° C. under reduced light conditions. Finally, optional components C), E) and F) are added.

As noted hereinbefore component E) is preferably a pigment, especially a blue or green pigment and is preferably prepared by any suitable attrition process such as grinding, pebble or bead milling the pigment together with dispersant in the presence of small amounts of component A) and/or component B). When component E) is a pigment it is added to the other components of the ink in a pre-dispersed form.

The ink composition is then preferably filtered at 20 to 25° C. to remove any particulate matter. Filtration also includes a process known as cascade filtration when the ink composition passes through successively finer filter media, for example, 10, 6, 4.5, 2.5 and 1.2 micron filters.

The etch-resistant ink may be exposed to actinic radiation and/or particle beam radiation at any convenient time after the ink is expressed from an ink-jet printing nozzle of a print head and includes in-flight and post-flight exposure of the ink.

After polymerisation of the etch-resistant ink by exposure to actinic radiation and/or particle beam radiation (e.g. electron beam), the laminate is subjected to a chemical etching process to remove those parts of the electrically conductive metal which are not protected by the polymerised etch-resistant ink. The removal of this metal results in the desired conductive metal circuitry having a coating of polymerised etch-resistant ink.

The chemical etching may be carried out by any means appropriate to the metal or alloy concerned. When the conductive metal is copper, etching is preferably carried out using aqueous acid copper (II) chloride, aqueous ammoniacal copper (II) complex and aqueous ferric chloride optionally containing hydrocholoric acid.

Etching is typically carried out at a temperature from 20 to 100° C. although it is preferably between 25 and 60° C. and includes spraying or dipping where the laminate may be contacted with the chemical etchant when in either the horizontal or vertical position.

Spraying is preferred, especially where the laminate is in the vertical position since this allows for quicker removal of the chemical etchant containing removed metal and/or alloy. The speed of etching may be accelerated by agitating the chemical etchant, for example, using sonic agitation.

As an obvious variant on the above, the dielectric substrate of the laminate may contain an electrically conductive metal or alloy on both sides so that each side of the laminate may be ink jet printed with a negative of electrically conductive circuitry. Both sides of such a laminate may be exposed to actinic radiation or particle beam simultaneously and the exposed metal may be chemically etched from both sides simultaneously.

After the laminate has been treated with the chemical etchant it is preferably rinsed with water to remove traces of the etchant and the laminate is then treated with alkali at a temperature from 0 to 100° C., preferably 40 to 60° C. to remove the etch-resistant polymer. This exposes the desired electrically conductive circuitry so that different electrically conductive circuits may be connected as desired. Finally, the laminate is rinsed with water and dried.

Laminates comprising a dielectric substrate and an electrically conductive circuitry made using the etch-resistant ink of the invention may be used singly or in combination in printed circuit boards (PCB's) in the manufacture of electronic devices.

Some of the etch-resistant inks form a further feature of the present invention. Hence, as a further aspect of the invention there is provided a non-aqueous etch-resistant ink for ink jet printing which is substantially free from organic solvents which comprises:

A) 30 to 90 parts acrylate functional monomers free from acid groups comprising mono or higher functionality wherein 5-95% by weight is one or more mono-functional monomers;

B) 1 to 30 parts acrylate functional monomer containing one or more acid groups;

C) 0 to 20 parts polymer or prepolymer;

D) 0.1 to 20 parts radical initiator;

E) 0 to 10 parts colorant;

F) 0 to 5 parts surfactant; and wherein the ink has a viscosity of not greater than 30 cPs (mPa·s) at 40° C. and all parts are by weight.

A further ink according to the invention is a non-aqueous etch-resistant ink for ink jet printing which is substantially free from organic solvents which comprises:
- A) 30 to 90 parts acrylate functional monomers free from acid groups comprising mono or higher functionality wherein 5-95% by weight is one or more mono-functional monomers;
- B) 1 to 30 parts acrylate functional monomer containing one or more acid groups;
- C) 0 to 20 parts polymer or prepolymer;
- D) 0.1 to 20 parts radical initiator;
- E) 0 to 10 parts colorant;
- F) 0 to 5 parts surfactant; and wherein the ink has an acid value of greater than 30 mg KOH/gm and less than 120 mg KOH/gm and all parts are by weight.

In one embodiment of the above inks the number of parts of components A)+B)+C)+D)+E)+F)=100.

Preferably, the acid group of component B) is a carboxylic acid group(s). It is also preferred that the acrylate functional monomer(s) containing one or more acid groups has an acid value of not less than 65 mg KOH/g and especially not less than 120 mg KOH/g.

The etch-resistant ink may be made available to manufacturers of electronic devices in the form of replacement or refillable cartridges for ink printers. Consequently, as a further aspect of the invention there is provided a cartridge comprising a chamber and an ink wherein the ink is present in the chamber and the ink is an etch-resistant ink as defined hereinbefore.

The etch-resistant ink according to the invention may be used in other related etching processes such as glass etching, ceramic etching, visual displays, silicon etching, micro-reactor fabrication, analytical device manufacture, sensor manufacture, organic semi-conductor patterning, inorganic semi-conductor patterning and dielectric patterning.

A further aspect of the present invention provides an electronic device obtained by a process according to the present invention.

The invention is further illustrated by the following non-limiting examples wherein all parts are by weight unless expressed to the contrary.

EXAMPLES 1 TO 51

The actual components used to make the etch-resistant ink and their amounts are detailed in Table 1 below. The acrylate functional monomer free from acid groups (components 1 to 11) and acrylate functional monomer containing one or more acid groups (components 12 to 20) were mixed together at 25° C. with stirring to obtain a homogenous solution. The radical initiator (components 21 to 30) was then added and the mixture stirred at 60° C. under reduced light until the radical initiator was dissolved. The mixture was then cooled to 25° C. and the surfactant (component 31) was added to give a liquid medium. A dispersion of the colorant (component 32) was prepared by milling the colorant and dispersant (component 33) in the presence of 3 mm diameter glass beads and a relatively small amount of acrylate functional monomer (1 to 11). This dispersion was then added to the liquid medium (components 1 to 31) and thoroughly mixed under reduced light. Finally, the mixture was cascade filtered through a series of fibre glass filters having a pore size of 10, 6, 4.5, 2.5 and 1.2µ to remove any particulate matter.

The properties of the inks are listed in Table 2 below. The viscosity of the ink was measured at 40° C. using a Brookfield viscometer equipped with No. 18 spindle rotating at 100 rpm. Surface tension was measured at 25° C. using a DuNony ring and jettability/ink performance was assessed after start-up and firing using a Spectra Galaxy 30 pt print head using an arbitrary scale of good, moderate and poor.

The ink was applied to a copper clad fibre glass/resin board to a thickness of 25µ using either a K-bar or by ink jet printing using a Spectra Galaxy printer. The ink was then cured by UV light exposure at 300-900 mJ/cm (or 2.8-3.6 W/cm$^2$ at a pass speed of 10-35 m/min) using a "Fusion D bulb" running at 120 W/cm.

The following properties of the cured film were assessed:
Pencil-hardness using IPC test method TM 2.4.27.2 from IPC-TM-650.
Adhesion using ASTM test method D 3359-87 and assessed as good, moderate or poor.
Etch-resistance using an acid ferric chloride strip bath at 50° C. for 10 minutes in an ultrasonic bath containing 28% ($^w/_w$) ferric chloride in 0.07% ($^w/_w$) hydrochloric acid:
Alkaline strip using 2.5-5% $^w/_w$ aqueous sodium hydroxide at 50° C. for 5 minutes in an ultrasonic strip bath.

Legends

The following legends are used throughout the examples:

| | |
|---|---|
| MAES | Mono-2-(methacryloyl oxyethyl)succinate ex Aldrich |
| Bis MAEP | Bis(2-(methacryloyloxy)ethyl phosphate ex Aldrich |
| EGMP | Ethyleneglycol methacrylate phosphate ex Aldrich |
| MAEPth | Mono-2(methacryloyloxy)ethyl phthalate ex Aldrich |

TABLE 1

Expressed in parts by weight.

| | | Example | | | | | | | | | |
|---|---|---|---|---|---|---|---|---|---|---|---|
| No. | Example | 1 | 2 | 3 | 4 | 5 | 6 | 7 | 8 | 9 | 10 |
| Acrylate Momoners | | | | | | | | | | | |
| 1 | Sartomer 506 | 34.9 | 29.9 | 34.9 | 29.9 | 29.9 | 29.9 | 29.9 | 29.9 | 35.7 | 33.2 |
| 2 | Sartomer 306 | 23 | 23 | 23 | 23 | 23 | 23 | 23 | 23 | 23 | 23 |
| 3 | Actilane 430 | 12.5 | 12.5 | 12.5 | 12.5 | 12.5 | 12.5 | 12.5 | 12.5 | 12.5 | 12.5 |
| 4 | Actilane 251 | 12.5 | 12.5 | 12.5 | 12.5 | 12.5 | 12.5 | 12.5 | 12.5 | 12.5 | 12.5 |
| 5 | Photomer 4072 | | | | | | | | | | |
| 6 | Photomer 5429 | | | | | | | | | | |
| 7 | Photomer 4039 | | | | | | | | | | |
| 8 | Lauryl acrylate | | | | | | | | | | |

TABLE 1-continued

Expressed in parts by weight.

| No. | | Example 6 | Example 7 | Example 8 | Example 9 | Example 10 |
|---|---|---|---|---|---|---|
| 9 | Isodecyl acrylate | | | | | |
| 10 | Actilane 411 | | | | | |
| 11 | Iso octyl acrylate | | | | | |
| | Acid Monomers | | | | | |
| 12 | Acrylic acid | 5 | 10 | | | 2.5 | 5 |
| 13 | Methacrylic acid | | | 5 | 10 | | |
| 14 | Itaconic acid | | | | | 10 | |
| 15 | Maleic acid | | | | | 10 | |
| 16 | MAES | | | | | | 10 |
| 17 | Fumaric acid | | | | | | 10 |
| 18 | Bis MAEP | | | | | | |
| 19 | EGMP | | | | | | |
| 20 | MAEPth | | | | | | |

| No. | Example | 11 | 12 | 13 | 14 | 15 | 16 | 17 | 18 | 19 |
|---|---|---|---|---|---|---|---|---|---|---|
| | Acrylate Momoners | | | | | | | | | |
| 1 | Sartomer 506 | 28.2 | 33.2 | 57 | 59.5 | 57.1 | 56.9 | 56.9 | 56.9 | 56.9 |
| 2 | Sartomer 306 | 23 | | 13 | 13 | 12.9 | 12.3 | 12.3 | 12.3 | 12.3 |
| 3 | Actilane 430 | 12.5 | | 5.6 | 5.6 | 5.6 | 6 | 6 | 6 | 6 |
| 4 | Actilane 251 | 12.5 | | 5.6 | 5.6 | 5.6 | 6 | 6 | 6 | 6 |
| 5 | Photomer 4072 | | 12.5 | | | | | | | |
| 6 | Photomer 5429 | | 12.5 | | | | | | | |
| 7 | Photomer 4039 | | 23 | | | | | | | |
| 8 | Lauryl acrylate | | | | | | | | | |
| 9 | Isodecyl acrylate | | | | | | | | | |
| 10 | Actilane 411 | | | | | | | | | |
| 11 | Iso octyl acrylate | | | | | | | | | |
| | Acid Monomers | | | | | | | | | |
| 12 | Acrylic acid | 10 | 5 | 5 | 2.5 | 5 | 5 | 5 | 5 | 5 |
| 13 | Methacrylic acid | | | | | | | | | |
| 14 | Itaconic acid | | | | | | | | | |
| 15 | Maleic acid | | | | | | | | | |
| 16 | MAES | | | | | | | | | |
| 17 | Fumaric acid | | | | | | | | | |
| 18 | Bis MAEP | | | | | | | | | |
| 19 | EGMP | | | | | | | | | |
| 20 | MAEPth | | | | | | | | | |

| No. | Example | 20 | 21 | 22 | 23 | 24 | 25 | 26 | 27 | 28 | 29 |
|---|---|---|---|---|---|---|---|---|---|---|---|
| | Acrylate Momoners | | | | | | | | | | |
| 1 | Sartomer 506 | 56.9 | 56.9 | 56.9 | 56.9 | 56.9 | 61.9 | 59.4 | 54.4 | 51.9 | 56.9 |
| 2 | Sartomer 306 | 12.3 | 12.3 | 12.3 | 12.3 | 12.3 | 12.3 | 12.3 | 12.3 | 12.3 | 12.3 |
| 3 | Actilane 430 | 6 | 6 | 6 | 6 | 6 | 6 | 6 | 6 | 6 | 6 |
| 4 | Actilane 251 | 6 | 6 | 6 | 6 | 6 | 6 | 6 | 6 | 6 | 6 |
| 5 | Photomer 4072 | | | | | | | | | | |
| 6 | Photomer 5429 | | | | | | | | | | |
| 7 | Photomer 4039 | | | | | | | | | | |
| 8 | Lauryl acrylate | | | | | | | | | | |
| 9 | Isodecyl acrylate | | | | | | | | | | |
| 10 | Actilane 411 | | | | | | | | | | |
| 11 | Iso octyl acrylate | | | | | | | | | | |
| | Acid Monomers | | | | | | | | | | |
| 12 | Acrylic acid | 5 | 5 | 5 | 5 | 5 | | 2.5 | 7.5 | 10 | |
| 13 | Methacrylic acid | | | | | | | | | | 5 |
| 14 | Itaconic acid | | | | | | | | | | |
| 15 | Maleic acid | | | | | | | | | | |
| 16 | MAES | | | | | | | | | | |
| 17 | Fumaric acid | | | | | | | | | | |
| 18 | Bis MAEP | | | | | | | | | | |
| 19 | EGMP | | | | | | | | | | |
| 20 | MAEPth | | | | | | | | | | |

TABLE 1-continued

Expressed in parts by weight.

| No. | Example | \multicolumn{10}{c}{Example} |
|---|---|---|---|---|---|---|---|---|---|---|---|
|  |  | 30 | 31 | 32 | 33 | 34 | 35 | 36 | 37 | 38 | 39 |
| Acrylate Momoners |
| 1 | Sartomer 506 | 56.9 | 2.3 | 2.3 | 2.3 | 2.3 | 2.3 | 21.15 | 21.15 | 21.15 | 21.15 |
| 2 | Sartomer 306 | 12.3 | 12.3 | 12.3 | 12.3 | 12.3 | 12.3 | 1.15 | 1.15 | 1.15 | 1.15 |
| 3 | Actilane 430 | 6 | 6 | 6 | 6 | 6 | 6 | 6 | 6 | 6 | 6 |
| 4 | Actilane 251 | 6 | 6 | 6 | 6 | 6 | 6 | 6 | 6 | 6 | 6 |
| 5 | Photomer 4072 |  |  |  |  |  |  |  |  |  |  |
| 6 | Photomer 5429 |  |  |  |  |  |  |  |  |  |  |
| 7 | Photomer 4039 |  | 54.6 |  |  |  |  | 43.6 | 38.6 | 43.6 | 38.6 |
| 8 | Lauryl acrylate |  |  | 54.6 |  |  |  |  |  |  |  |
| 9 | Isodecyl acrylate |  |  |  | 54.6 |  |  |  |  |  |  |
| 10 | Actilane 411 |  |  |  |  | 54.6 |  |  |  |  |  |
| 11 | Iso octyl acrylate |  |  |  |  |  | 54.6 |  |  |  |  |
| Acid Monomers |
| 12 | Acrylic acid |  | 5 | 5 | 5 | 5 | 5 | 5 | 5 | 5 | 5 |
| 13 | Methacrylic acid |  |  |  |  |  |  |  |  |  |  |
| 14 | Itaconic acid |  |  |  |  |  |  |  |  |  |  |
| 15 | Maleic acid |  |  |  |  |  |  |  |  |  |  |
| 16 | MAES | 5 |  |  |  |  |  |  |  |  |  |
| 17 | Fumaric acid |  |  |  |  |  |  | 5 | 10 |  |  |
| 18 | Bis MAEP |  |  |  |  |  |  |  |  | 5 |  |
| 19 | EGMP |  |  |  |  |  |  |  |  |  | 10 |
| 20 | MAEPth |  |  |  |  |  |  |  |  |  |  |

| No. | Example | \multicolumn{9}{c}{Example} |
|---|---|---|---|---|---|---|---|---|---|---|
|  |  | 40 | 41 | 42 | 43 | 44 | 45 | 46 | 47 | 48 |
| Acrylate Momoners |
| 1 | Sartomer 506 | 21.5 | 21.15 | 26.15 | 31.15 | 36.15 | 41.15 | 8.35 | 8.35 | 8.35 |
| 2 | Sartomer 306 | 1.15 | 1.15 | 1.15 | 1.15 | 1.15 | 1.15 | 8.35 | 66.35 | 37.35 |
| 3 | Actilane 430 | 6 | 6 | 6 | 6 | 6 | 6 | 33.1 | 4.1 | 18.6 |
| 4 | Actilane 251 | 6 | 6 | 6 | 6 | 6 | 6 | 33.1 | 4.1 | 18.6 |
| 5 | Photomer 4072 |  |  |  |  |  |  |  |  |  |
| 6 | Photomer 5429 |  |  |  |  |  |  |  |  |  |
| 7 | Photomer 4039 | 43.6 | 38.6 | 33.6 | 28.6 | 23.6 | 18.6 |  |  |  |
| 8 | Lauryl acrylate |  |  |  |  |  |  |  |  |  |
| 9 | Isodecyl acrylate |  |  |  |  |  |  |  |  |  |
| 10 | Actilane 411 |  |  |  |  |  |  |  |  |  |
| 11 | Iso octyl acrylate |  |  |  |  |  |  |  |  |  |
| Acid Monomers |
| 12 | Acrylic acid | 5 | 5 | 5 | 5 | 5 | 5 | 5 | 5 | 5 |
| 13 | Methacrylic acid |  |  |  |  |  |  |  |  |  |
| 14 | Itaconic acid |  |  |  |  |  |  |  |  |  |
| 15 | Maleic acid |  |  |  |  |  |  |  |  |  |
| 16 | MAES |  |  |  |  |  |  |  |  |  |
| 17 | Fumaric acid |  |  |  |  |  |  |  |  |  |
| 18 | Bis MAEP |  |  |  |  |  |  |  |  |  |
| 19 | EGMP |  |  |  |  |  |  |  |  |  |
| 20 | MAEPth | 5 | 10 | 10 | 10 | 10 | 10 |  |  |  |

| No. | Example | \multicolumn{4}{c}{Example} |
|---|---|---|---|---|---|
|  |  | 49 | 50 | 51 | Control |
| Acrylate Momoners |
| 1 | Sartomer 506 | 53.2 | 43.2 | 33.2 | 39.9 |
| 2 | Sartomer 306 | 0.59 | 0.59 | 0.59 | 23.0 |
| 3 | Actilane 430 |  |  |  | 12.5 |
| 4 | Actilane 251 |  |  |  | 12.5 |
| 5 | Photomer 4072 |  |  |  |  |
| 6 | Photomer 5429 | 15.0 | 15.0 | 15.0 |  |
| 7 | Photomer 4039 | 15.0 | 15.0 | 15.0 |  |
| 8 | Lauryl acrylate |  |  |  |  |
| 9 | Isodecyl acrylate |  |  |  |  |
| 10 | Actilane 411 |  |  |  |  |
| 11 | Iso octyl acrylate |  |  |  |  |

TABLE 1-continued

Expressed in parts by weight.

Acid Monomers

| No. | Name |
|---|---|
| 12 | Acrylic acid |
| 13 | Methacrylic acid |
| 14 | Itaconic acid |
| 15 | Maleic acid |
| 16 | MAES |
| 17 | Fumaric acid |
| 18 | Bis MAEP |
| 19 | EGMP |
| 20 | MAEPth |

(Acrylic acid row values: 5.0, 5.0, 5.0)

| No. | Example | 1 | 2 | 3 | 4 | 5 | 6 | 7 | 8 | 9 | 10 |
|---|---|---|---|---|---|---|---|---|---|---|---|
| | Initiators | | | | | | | | | | |
| 21 | Speedcure ITX | 2 | 2 | 2 | 2 | 2 | 2 | 2 | 2 | 2 | 2 |
| 22 | Speedcure EHA | 4 | 4 | 4 | 4 | 4 | 4 | 4 | 4 | 4 | 4 |
| 23 | Irgacure 369 | 4 | 4 | 4 | 4 | 4 | 4 | 4 | 4 | 4 | 4 |
| 24 | Irgacure 907 | | | | | | | | | | |
| 25 | Daracure 1173 | | | | | | | | | | |
| 26 | Benzophenone | | | | | | | | | | |
| 27 | Speedcure DETX | | | | | | | | | | |
| 28 | Irgacure 1850 | | | | | | | | | | |
| 29 | Speedcure 3040 | | | | | | | | | | |
| 30 | Irgacure 184 | | | | | | | | | | |
| | Surfactants | | | | | | | | | | |
| 31 | Tegorad 2200N | 0.4 | 0.4 | 0.4 | 0.4 | 0.4 | 0.4 | 0.4 | 0.4 | 0.4 | 0.4 |
| | Colorant | | | | | | | | | | |
| 32 | Irgalite Blue GLVO | 1 | 1 | 1 | 1 | 1 | 1 | 1 | 1 | 2 | 2 |
| 33 | Solsperse dispersant | 0.7 | 0.7 | 0.7 | 0.7 | 0.7 | 0.7 | 0.7 | 0.7 | 1.4 | 1.4 |

| No. | Example | 11 | 12 | 13 | 14 | 15 | 16 | 17 | 18 | 19 |
|---|---|---|---|---|---|---|---|---|---|---|
| | Initiators | | | | | | | | | |
| 21 | Speedcure ITX | 2 | 2 | 2 | 2 | 2 | 2 | 2 | 2 | |
| 22 | Speedcure EHA | 4 | 4 | 4 | 4 | 4 | 4 | 4 | 4 | 4 |
| 23 | Irgacure 369 | 4 | 4 | 4 | 4 | 4 | 4 | | | 4 |
| 24 | Irgacure 907 | | | | | | | 4 | | |
| 25 | Daracure 1173 | | | | | | | | 4 | |
| 26 | Benzophenone | | | | | | | | | 2 |
| 27 | Speedcure DETX | | | | | | | | | |
| 28 | Irgacure 1850 | | | | | | | | | |
| 29 | Speedcure 3040 | | | | | | | | | |
| 30 | Irgacure 184 | | | | | | | | | |
| | Surfactants | | | | | | | | | |
| 31 | Tegorad 2200N | 0.4 | 0.4 | 0.4 | 0.4 | 0.4 | 0.4 | 0.4 | 0.4 | 0.4 |
| | Colorant | | | | | | | | | |
| 32 | Irgalite Blue GLVO | 2 | 2 | 2 | 2 | 2 | 2 | 2 | 2 | 2 |
| 33 | Solsperse dispersant | 1.4 | 1.4 | 1.4 | 1.4 | 1.4 | 1.4 | 1.4 | 1.4 | 1.4 |

| No. | Example | 20 | 21 | 22 | 23 | 24 | 25 | 26 | 27 | 28 | 29 |
|---|---|---|---|---|---|---|---|---|---|---|---|
| | Initiators | | | | | | | | | | |
| 21 | Speedcure ITX | | | 4 | | | 2 | 2 | 2 | 2 | 2 |
| 22 | Speedcure EHA | 4 | | 6 | | | 4 | 4 | 4 | 4 | 4 |
| 23 | Irgacure 369 | 4 | 10 | | | | 4 | 4 | 4 | 4 | 4 |
| 24 | Irgacure 907 | | | | | | | | | | |
| 25 | Daracure 1173 | | | | 5 | | | | | | |
| 26 | Benzophenone | | | | | | | | | | |
| 27 | Speedcure DETX | 2 | | | | | | | | | |
| 28 | Irgacure 1850 | | | | 5 | | | | | | |
| 29 | Speedcure 3040 | | | | | 10 | | | | | |
| 30 | Irgacure 184 | | | | | | | | | | |

TABLE 1-continued

Expressed in parts by weight.

| | Surfactants | | | | | | | | | | |
|---|---|---|---|---|---|---|---|---|---|---|---|
| 31 | Tegorad 2200N | 0.4 | 0.4 | 0.4 | 0.4 | 0.4 | 0.4 | 0.4 | 0.4 | 0.4 | 0.4 |
| | Colorant | | | | | | | | | | |
| 32 | Irgalite Blue GLVO | 2 | 2 | 2 | 2 | 2 | 2 | 2 | 2 | 2 | 2 |
| 33 | Solsperse dispersant | 1.4 | 1.4 | 1.4 | 1.4 | 1.4 | 1.4 | 1.4 | 1.4 | 1.4 | 1.4 |

| | | Example | | | | | | | | | |
|---|---|---|---|---|---|---|---|---|---|---|---|
| No. | Example | 30 | 31 | 32 | 33 | 34 | 35 | 36 | 37 | 38 | 39 |
| | Initiators | | | | | | | | | | |
| 21 | Speedcure ITX | 2 | 2 | 2 | 2 | 2 | 2 | 2 | 2 | 2 | 2 |
| 22 | Speedcure EHA | 4 | 4 | 4 | 4 | 4 | 4 | 4 | 4 | 4 | 4 |
| 23 | Irgacure 369 | 4 | 4 | 4 | 4 | 4 | 4 | 4 | 4 | 4 | 4 |
| 24 | Irgacure 907 | | | | | | | | | | |
| 25 | Daracure 1173 | | | | | | | | | | |
| 26 | Benzophenone | | | | | | | | | | |
| 27 | Speedcure DETX | | | | | | | | | | |
| 28 | Irgacure 1850 | | | | | | | | | | |
| 29 | Speedcure 3040 | | | | | | | | | | |
| 30 | Irgacure 184 | | | | | | | | | | |
| | Surfactants | | | | | | | | | | |
| 31 | Tegorad 2200N | 0.4 | 0.4 | 0.4 | 0.4 | 0.4 | 0.4 | 0.4 | 0.4 | 0.4 | 0.4 |
| | Colorant | | | | | | | | | | |
| 32 | Irgalite Blue GLVO | 2 | 2 | 2 | 2 | 2 | 2 | 1 | 1 | 1 | 1 |
| 33 | Solsperse dispersant | 1.4 | 1.4 | 1.4 | 1.4 | 1.4 | 1.4 | 0.7 | 0.7 | 0.7 | 0.7 |

| | | Example | | | | | | | | | |
|---|---|---|---|---|---|---|---|---|---|---|---|
| No. | Example | 40 | 41 | 42 | 43 | 44 | 45 | 46 | 47 | 48 |
| | Initiators | | | | | | | | | | |
| 21 | Speedcure ITX | 2 | 2 | 2 | 2 | 2 | 2 | 2 | 2 | 2 |
| 22 | Speedcure EHA | 4 | 4 | 4 | 4 | 4 | 4 | 4 | 4 | 4 |
| 23 | Irgacure 369 | 4 | 4 | 4 | 4 | 4 | 4 | 4 | 4 | 4 |
| 24 | Irgacure 907 | | | | | | | | | |
| 25 | Daracure 1173 | | | | | | | | | |
| 26 | Benzophenone | | | | | | | | | |
| 27 | Speedcure DETX | | | | | | | | | |
| 28 | Irgacure 1850 | | | | | | | | | |
| 29 | Speedcure 3040 | | | | | | | | | |
| 30 | Irgacure 184 | | | | | | | | | |
| | Surfactants | | | | | | | | | | |
| 31 | Tegorad 2200N | 0.4 | 0.4 | 0.4 | 0.4 | 0.4 | 0.4 | 0.4 | 0.4 | 0.4 |
| | Colorant | | | | | | | | | | |
| 32 | Irgalite Blue GLVO | 1 | 1 | 1 | 1 | 1 | 1 | 1 | 1 | 1 |
| 33 | Solsperse dispersant | 0.7 | 0.7 | 0.7 | 0.7 | 0.7 | 0.7 | 0.7 | 0.7 | 0.7 |

| | | Example | | | |
|---|---|---|---|---|---|
| No. | Example | 49 | 50 | 51 | Control |
| | Initiators | | | | |
| 21 | Speedcure ITX | | | | 2.0 |
| 22 | Speedcure EHA | | | | 4.0 |
| 23 | Irgacure 369 | 5.0 | 5.0 | 5.0 | 4.0 |
| 24 | Irgacure 907 | | | | |
| 25 | Daracure 1173 | | | | |
| 26 | Benzophenone | | | | |
| 27 | Speedcure DETX | | | | |
| 28 | Irgacure 1850 | | | | |
| 29 | Speedcure 3040 | | | | |
| 30 | Irgacure 184 | 5.0 | 5.0 | 5.0 | |
| | Surfactants | | | | |
| 31 | Tegorad 2200N | 0.4 | 0.4 | 0.4 | 0.4 |

TABLE 1-continued

Expressed in parts by weight.

| | Colorant | | | | |
|---|---|---|---|---|---|
| 32 | Irgalite Blue GLVO | 0.5 | 0.5 | 0.5 | 1.0 |
| 33 | Solsperse dispersant | 0.31 | 0.31 | 0.31 | 0.7 |

TABLE 2

| Example | Example | | | | | | | | | |
|---|---|---|---|---|---|---|---|---|---|---|
| | 1 | 2 | 3 | 4 | 5 | 6 | 7 | 8 | 9 | 10 |
| Viscosity at 40° C. (mPa·s) | 12.0 | 13.6 | 12.8 | 11.4 | | | | | 13.3 | 13.2 |
| ST (mN/m) | 26.0 | 25.5 | | | | | | | 26.5 | 27 |
| Pencil hardness | 4H | 6H | F | 2H | | | 4H | | | |
| Adhesion | good | good | good | good | | | | | good | good |
| Ink jet performance | | | | | | | | | good | good |
| Etch resistance | yes | yes | | | | | yes | | yes | yes |
| Alkaline strip | yes | yes | yes | yes | | | yes | | yes | yes |

| Example | Example | | | | | | | | |
|---|---|---|---|---|---|---|---|---|---|
| | 11 | 12 | 13 | 14 | 15 | 16 | 17 | 18 | 19 |
| Viscosity at 40° C. (mPa·s) | 13.6 | | | 8.2 | 7.8 | | | | |
| ST (mN/m) | 23 | | | 28 | 28 | | | | |
| Pencil hardness | | 2H | | 2-3H | | 2-4H | 2-4H | 2-4H | 2-4H |
| Adhesion | | good | good | good | good | good | good | good | good |
| Ink jet performance | good | | | | | | | | |
| Etch resistance | yes | yes | | | | yes | yes | yes | yes |
| Alkaline strip | yes | yes | | | | | | | |

| Example | Example | | | | | | | | | |
|---|---|---|---|---|---|---|---|---|---|---|
| | 20 | 21 | 22 | 23 | 24 | 25 | 26 | 27 | 28 | 29 |
| Viscosity at 40° C. (mPa·s) | | | | | | | | | | |
| ST (mN/m) | | | | | | | | | | |
| Pencil hardness | 5H | 5H | H | 2-4H | 2-4H | <HB | 3H | 5H | 5H | H |
| Adhesion | good | good | good | good | good | poor | poor | good | good | good |
| Ink jet performance | | | | | | | | | | |
| Etch resistance | yes | yes | | | | | | | | |
| Alkaline strip | | | | | | yes | yes | yes | yes | yes |

| Example | Example | | | | | | | | | |
|---|---|---|---|---|---|---|---|---|---|---|
| | 30 | 31 | 32 | 33 | 34 | 35 | 36 | 37 | 38 | 39 |
| Viscosity at 40° C. (mPa·s) | | | | | | | | | | |
| ST (mN/m) | | | | | | | | | | |
| Pencil hardness | 6H | <HB | <HB | <HB | 3H | H | H | 3H | 3H | 3H |
| Adhesion | good | moderate | good | moderate | moderate | good | good | good | good | good |
| Ink jet performance | | | | | | | | | | |
| Etch resistance | | | | | | yes | yes | yes | yes | |
| Alkaline strip | yes | yes | yes | yes | yes | yes | yes | yes | yes | yes |

| Example | Example | | | | | | | | |
|---|---|---|---|---|---|---|---|---|---|
| | 40 | 41 | 42 | 43 | 44 | 45 | 46 | 47 | 48 |
| Viscosity at 40° C. (mPa·s) | | | | | | | | | |
| ST (mN/m) | | | | | | | | | |
| Pencil hardness | | H | 3H | 3-4H | 3H | 4H | 4H | 4H | 5H | 4H |
| Adhesion | | good | good | good | good | good | good | | good | good |
| Ink jet performance | | | | | | | | | | |
| Etch resistance | | yes | yes | yes | yes | yes | yes | yes | yes | Yes |
| Alkaline strip | | | yes | yes | yes | yes | yes | | | |

TABLE 2-continued

| | Example | | | |
|---|---|---|---|---|
| Example | 49 | 50 | 51 | Control |
| Viscosity at 40° C. (mPa · s) | | 10.9 | | 12.9 |
| ST (mN/m) | | 26 | | 26.5 |
| Pencil hardness | | | | HB |
| Adhesion | good | good | good | poor |
| Ink jet performance | | good | | good |
| Etch resistance | yes | yes | yes | yes |
| Alkaline strip | yes | yes | yes | no |

The invention claimed is:

1. A process for making an electronic device comprising a dielectric substrate laminated with an electrically conductive metal or alloy which comprises applying a non-aqueous etch-resistant ink by ink jet printing to selected areas of the metal or alloy, exposing the etch-resistant ink to actinic radiation and/or particle beam radiation to effect polymerisation, removing exposed metal or alloy by a chemical etching process and then removing the polymerised etch-resistant ink by alkali wherein the etch-resistant ink is substantially solvent free and comprises the components:
   A) 30 to 90 parts acrylate functional monomers free from acid groups comprising mono or higher functionality wherein 5-95% by weight is one or more mono-functional monomers;
   B) 1 to 30 parts acrylate functional monomer containing one or more acid groups;
   C) 0 to 20 parts polymer or prepolymer;
   D) 0 to 20 parts radical initiator;
   E) 0 to 5 parts colorant;
   F) 0 to 5 parts surfactant; and
wherein the ink has a viscosity of not greater than 30 cPs (mPa.s) at 40° C. and all parts are by weight.

2. A process as claimed in claim 1 wherein the amount of mono-functional acrylate monomer is 70-95% by weight of component A).

3. A process as claimed in claim 1 wherein the amount of component B) is not greater than 10 parts.

4. A process as claimed in claim 1 wherein the amount of component B) is not less than 6 parts.

5. A process as claimed in claim 1 wherein component B) is acrylic acid or mono-2-(methacryloyl)ethyl phthalate.

6. A process as claimed in claim 1 wherein the radical initiator is a photoinitiator activated by UV light.

7. A process as claimed in claim 1 wherein the ink has a surface tension of from 20 to 40 mN/m.

8. A process as claimed in claim 1 wherein the viscosity of the ink is from 8 to 20 cPs (mPa.s) at 40° C.

9. A process as claimed in claim 1 wherein component B) has an acid value of not less than 100 mg KOH/g.

10. A process as claimed in claim 1 wherein the total etch-resistant ink has an acid value greater than 30 mg KOH/gm.

11. A process as claimed in claim 1 wherein the amount of polymer or prepolymer (component C)) is zero.

12. A process as claimed in claim 1 wherein the amount of radical initiator is not less than 0.1 parts.

13. A process as claimed in claim 1 wherein the number of parts of components A)+B)+C)+D)+E)+F)=100.

* * * * *